United States Patent
Levy et al.

(10) Patent No.: US 10,475,712 B2
(45) Date of Patent: Nov. 12, 2019

(54) SYSTEM AND METHOD FOR PROCESS-INDUCED DISTORTION PREDICTION DURING WAFER DEPOSITION

(71) Applicant: KLA-Tencor Corporation, Milpitas, CA (US)

(72) Inventors: Ady Levy, San Jose, CA (US); Mark D. Smith, San Jose, CA (US)

(73) Assignee: KLA-Tencor Corporation, Milpitas, CA (US)

( * ) Notice: Subject to any disclaimer, the term of this patent is extended or adjusted under 35 U.S.C. 154(b) by 0 days.

(21) Appl. No.: 15/707,927

(22) Filed: Sep. 18, 2017

(65) Prior Publication Data

US 2018/0096906 A1    Apr. 5, 2018

Related U.S. Application Data

(60) Provisional application No. 62/402,213, filed on Sep. 30, 2016.

(51) Int. Cl.
*H01L 21/66* (2006.01)
*C23C 16/52* (2006.01)
(Continued)

(52) U.S. Cl.
CPC ............ *H01L 22/24* (2013.01); *C23C 14/547* (2013.01); *C23C 16/52* (2013.01);
(Continued)

(58) Field of Classification Search
CPC combination set(s) only.
See application file for complete search history.

(56) References Cited

U.S. PATENT DOCUMENTS 6,847,458 B2    1/2005    Freischlad et al.
7,847,954 B2    12/2010   Tang et al.
(Continued)

FOREIGN PATENT DOCUMENTS

WO    2014059250 A1    4/2014

OTHER PUBLICATIONS

International Search Report and Written Opinion dated Jan. 17, 2018 for PCT/US2017/054279.
(Continued)

*Primary Examiner* — Ratisha Mehta
(74) *Attorney, Agent, or Firm* — Suiter Swantz pc llo (57) ABSTRACT

A system is disclosed. The system includes a tool cluster. The tool cluster includes a first deposition tool configured to deposit a first layer on a wafer. The tool cluster additionally includes an interferometer tool configured to obtain one or more measurements of the wafer. The tool cluster additionally includes a second deposition tool configured to deposit a second layer on the wafer. The tool cluster additionally includes a vacuum assembly. One or more correctables configured to adjust at least one of the first deposition tool or the second deposition tool are determined based on the one or more measurements. The one or more measurements are obtained between the deposition of the first layer and the deposition of the second layer without breaking the vacuum generated by the vacuum assembly.

23 Claims, 7 Drawing Sheets

(51) Int. Cl.
*G01B 11/06* (2006.01)
*H01L 21/67* (2006.01)
*C23C 14/54* (2006.01)
*G03F 7/20* (2006.01)

(52) U.S. Cl.
CPC .... *G01B 11/0675* (2013.01); *H01L 21/67161* (2013.01); *H01L 21/67253* (2013.01); *H01L 21/67288* (2013.01); *H01L 22/12* (2013.01); *H01L 22/20* (2013.01); *G03F 7/70525* (2013.01)

(56) References Cited

U.S. PATENT DOCUMENTS

| | | | |
|---|---|---|---|
| 8,068,234 | B2 | 11/2011 | Tang et al. |
| 9,087,176 | B1 | 7/2015 | Chang et al. |
| 9,354,526 | B2 | 5/2016 | Vukkadala et al. |
| 9,430,593 | B2 | 8/2016 | Vukkadala et al. |
| 15,622,629 | | 6/2017 | Chen et al. |
| 2007/0046927 | A1* | 3/2007 | Le ............ C23C 14/54 356/73 |
| 2012/0094400 | A1 | 4/2012 | Adel et al. |
| 2014/0293291 | A1 | 10/2014 | Tang |
| 2015/0120216 | A1 | 4/2015 | Vukkadala et al. |
| 2016/0146590 | A1* | 5/2016 | Chen ............ G01B 9/02027 356/477 |
| 2016/0283625 | A1 | 9/2016 | Vukkadala et al. |
| 2016/0372353 | A1 | 12/2016 | Vukkadala et al. |

OTHER PUBLICATIONS

Freund, L. B., and S. Suresh, Thin Film Materials: Stress, Defect Formation and Surface Evolution, Cambridge, Cambridge University Press, 2004.

Turner et al., Monitoring Process-Induced Overlay Errors through High-Resolution Wafer Geometry Measurements, Proc. SPIE 9050, Metrology, Inspection, and Process Control for Microlithography XXVIII, 905013, Apr. 2, 2014.

* cited by examiner

SYSTEM AND METHOD FOR PROCESS-INDUCED DISTORTION PREDICTION DURING WAFER DEPOSITION

CROSS-REFERENCE TO RELATED APPLICATIONS

The present application claims the benefit under 35 U.S.C. § 119(e) of U.S. Provisional Patent Application Ser. No. 62/402,213, filed Sep. 30, 2016, entitled SIMPLIFIED MODEL FOR PROCESS-INDUCED DISTORTION PREDICTION, naming Ady Levy and Mark D. Smith as inventors, which is incorporated herein by reference in the entirety.

TECHNICAL FIELD

The present invention generally relates to semiconductor wafer fabrication and metrology and, more particularly, to systems and methods for the prediction of process-induced distortions during wafer deposition.

BACKGROUND

The fabrication of semiconductor devices, such as logic and memory devices, typically includes processing a semiconductor device using a large number of semiconductor fabrication and metrology processes to form various features and multiple layers of the semiconductor device. Some fabrication processes utilize photomasks/reticles to print features on a semiconductor device such as a wafer. As semiconductor devices become smaller and smaller, it becomes critical to develop enhanced inspection and review devices and procedures to increase the resolution, speed, and throughput of wafer and photomask/reticle inspection processes.

One semiconductor device fabrication technology includes fabricating the semiconductor device via the application of multiple coating layers to one or more surfaces of a semiconductor wafer. Semiconductor devices are typically fabricated to meet a selected set of device shape and/or size requirements (e.g., wafer flatness or wafer thickness). However, the various process steps necessary to fabricate the semiconductor device, as well as variation in the thickness of layers during application, can result in deformation (e.g., elastic deformation) that results in distortion of the semiconductor device.

Semiconductor device distortions may be out-of-plane (OPD) or in-plane (IPD), and may lead to errors (e.g., patterning errors). Measured OPD and/or IPD is one type of data that may be provided in a feed forward loop or a feedback loop to adjust the various semiconductor fabrication and/or metrology processes within the tool cluster. For example, measuring the OPD of a semiconductor device may be utilized to predict IPD of the semiconductor device. However, the metrology processes to measure the OPD and/or the IPD are typically separate from the fabrication processes to fabricate the semiconductor devices.

OPD and/or IPD may form after a layer is deposited onto the wafer. Although it may be beneficial to measure between deposition steps of the fabrication processes, it can be costly and/or time-intensive to remove and replace the partially-fabricated semiconductor devices from the semiconductor device processing tool clusters.

Therefore, it would be desirable to provide a system and corresponding method that cures the shortcomings as described above.

SUMMARY

A system is disclosed, in accordance with one or more embodiments of the present disclosure. In one embodiment, the system includes a tool cluster. In another embodiment, the tool cluster includes a first deposition tool. In another embodiment, the first deposition tool is configured to deposit a first layer on a wafer. In another embodiment, the tool cluster includes an interferometer tool. In another embodiment, the interferometer tool is configured to obtain one or more measurements of the wafer. In another embodiment, the tool cluster includes a second deposition tool. In another embodiment, the second deposition tool is configured to deposit a second layer on the wafer. In another embodiment, the tool cluster includes a vacuum assembly. In another embodiment, one or more correctables configured to adjust at least one of the first deposition tool or the second deposition tool are determined based on the one or more measurements. In another embodiment, the one or more measurements are obtained between the deposition of the first layer and the deposition of the second layer without breaking the vacuum generated by the vacuum assembly.

A method is disclosed, in accordance with one or more embodiments of the present disclosure. In one embodiment, the method may include, but is not limited to, depositing a first layer on a wafer via a first deposition tool of a tool cluster. In another embodiment, the method may include, but is not limited to, obtaining one or more measurements of the first layer on the wafer via an interferometer tool of the tool cluster. In another embodiment, the one or more measurements include one or more out-of-plane distortions. In another embodiment, the method may include, but is not limited to, estimating one or more in-plane distortions for the first layer on the wafer via a controller of the interferometer tool of the tool cluster. In another embodiment, the one or more in-plane distortions are estimated based on the one or more out-of-plane distortions. In another embodiment, the method may include, but is not limited to, determining one or more correctables for the wafer via the controller of the interferometer tool of the tool cluster. In another embodiment, the one or more correctables are determined based on the one or more in-plane distortions. In another embodiment, the method may include, but is not limited to, providing the one or more correctables to adjust at least one of the first deposition tool or a second deposition tool of the tool cluster. In another embodiment, the tool cluster includes a vacuum assembly. In another embodiment, the one or more measurements are obtained between the deposition of the first layer and the deposition of the second layer without breaking the vacuum of the vacuum assembly.

It is to be understood that both the foregoing general description and the following detailed description are exemplary and explanatory only and are not necessarily restrictive of the present disclosure. The accompanying drawings, which are incorporated in and constitute a part of the characteristic, illustrate subject matter of the disclosure. Together, the descriptions and the drawings serve to explain the principles of the disclosure.

BRIEF DESCRIPTION OF THE DRAWINGS

The numerous advantages of the disclosure may be better understood by those skilled in the art by reference to the accompanying figures in which.

DETAILED DESCRIPTION OF THE INVENTION

Reference will now be made in detail to the subject matter disclosed, which is illustrated in the accompanying drawings.

Referring generally to FIGS. 1-5, systems and methods for process-induced distortion prediction during wafer deposition are described, in accordance with the present disclosure.

Embodiments of the present disclosure are directed to a semiconductor fabrication system including one or more deposition tools and one or more interferometer tools. Embodiments of the present disclosure are also directed to measuring a layer deposited on a semiconductor wafer between deposition steps without breaking vacuum of the semiconductor fabrication system. Embodiments of the present disclosure are also directed to estimating process-induced distortion based on the measured layer. Embodiments of the present disclosure are also directed to determining one or more correctables based on the estimated process-induced distortion. Embodiments of the present disclosure are also directed to providing the one or more correctables to adjust a fabrication recipe of the deposition tool via a feed forward loop and/or a feedback loop.

Figure 1:
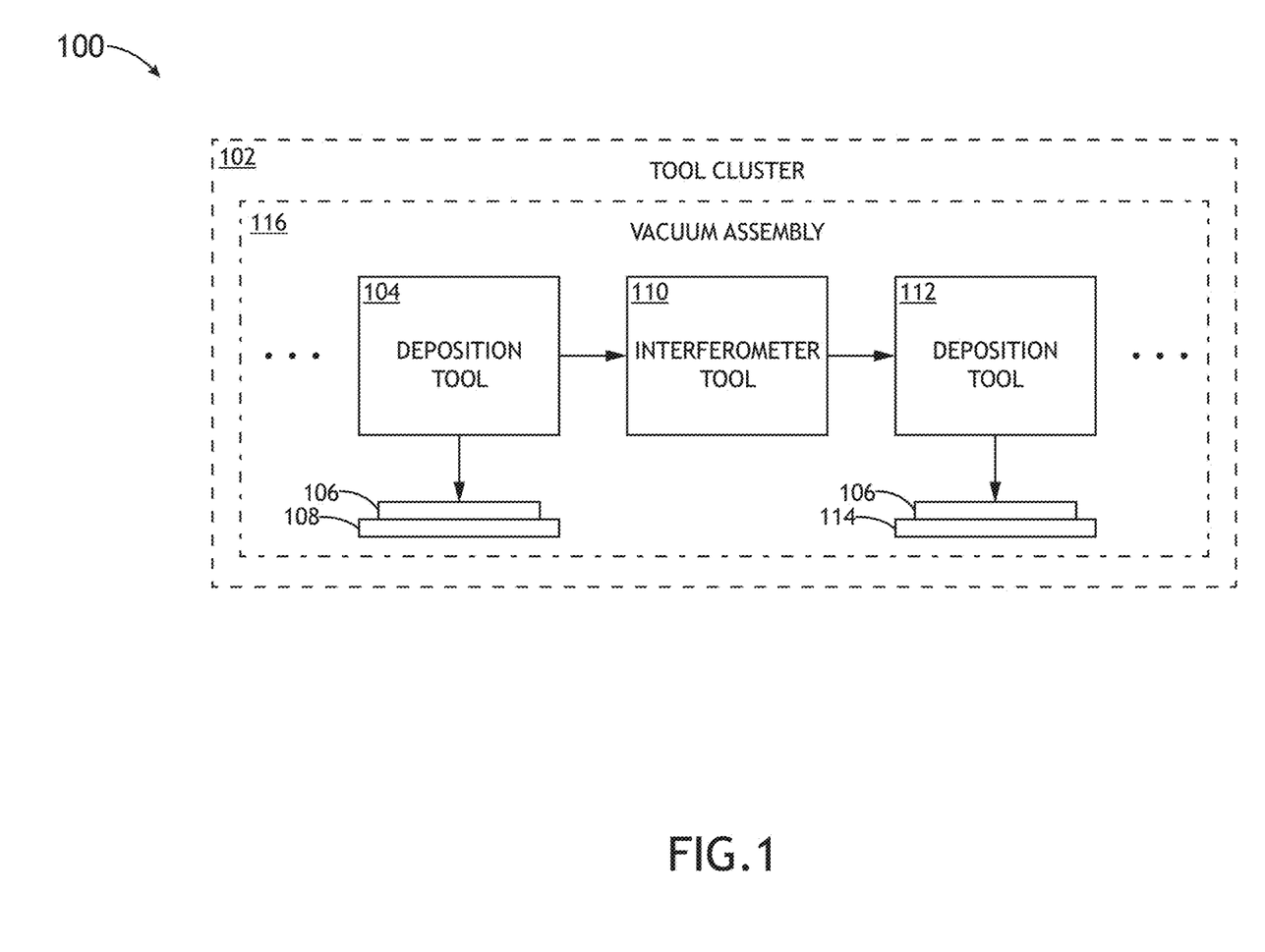
FIG. 1 illustrates a block diagram view of a system for process-induced distortion prediction during wafer deposition, in accordance with one or more embodiments of the present disclosure.

Referring now to FIG. 1, a system 100 for process-induced distortion prediction during wafer deposition is disclosed, in accordance with one or more embodiments of the present disclosure.

In one embodiment, the system 100 includes a tool cluster 102. In another embodiment, the tool cluster 102 includes a deposition tool 104. In another embodiment, the deposition tool 104 deposits a layer on a sample 106, where the sample 106 is secured on a sample stage 108. For example, the layer may be deposited on a front side or a back side of the sample 106.

In another embodiment, the tool cluster 102 includes an interferometer tool 110. In another embodiment, the interferometer tool 110 obtains one or more measurements of a deposited layer on the sample 106. In another embodiment, the interferometer tool 110 obtains the one or more measurements of the deposited layer on the sample 106 following the depositing of the layer by the deposition tool 104.

In another embodiment, the tool cluster 102 includes a deposition tool 112. In another embodiment, the deposition tool 112 deposits a layer on the sample 106, where the sample 106 is secured on a sample stage 114. For example, the layer may be deposited on a front side of the sample 106, a back side of the sample 106, or on the layer on the sample 106 deposited by the deposition tool 104. In another embodiment, the deposition tool 112 deposits the layer on the sample 106 following the obtaining of the one or more measurements of the layer deposited by the deposition tool 104 via the interferometer tool 110.

In another embodiment, the tool cluster 102 includes a vacuum assembly 116. In another embodiment, the deposition tools 104, 112 and the interferometer tool 110 are set within the vacuum assembly 116 of the tool cluster 102. In another embodiment, the interferometer tool 110 obtains the one or more measurements of the sample 106 between the deposition of layers by the deposition tools 104, 112 without breaking the vacuum generated by the vacuum assembly 116 between deposition processes.

For example, obtaining the one or more measurements between the deposition of layers may allow for non-conformities in a deposited layer to be adjusted and/or compensated for in subsequent depositions by the deposition tools 104, 112. In this regard, the non-conformities may be reduced in the sample 106 by adjusting subsequent deposition steps of the deposited layer on subsequent samples 106 and/or compensating via subsequent deposition steps on the same sample 106 (e.g., in a feed forward loop or a feedback loop) to reduce the overall stress and promote uniformity of the sample 106.

By way of another example, obtaining the one or more measurements may allow for the quantifying of generated film stress caused by a film layer deposited on the back side of the sample 106, as the sample 106 may bend and/or warp due to a stress imbalance between the front side and the back side of the sample 106. In this regard, the film stress may be characterized and reduced by adjusting subsequent deposition steps of the deposited layer on subsequent samples 106 and/or compensating via subsequent deposition steps on the same sample 106 (e.g., in a feed forward loop or a feedback loop).

It is noted herein the tool cluster 102 is not limited to including only the deposition tool 104, the interferometer tool 110, and the deposition tool 112. For example, the tool cluster 102 may include one or more deposition tools and/or one or more interferometer tools prior to the deposition tool 104 in the tool cluster 102. By way of another example, the tool cluster 102 may include one or more deposition tools and/or one or more interferometer tool following the deposition tool 112 in the tool cluster 102. By way of another example, the tool cluster 102 may include the interferometer tool 110 and either only the deposition tool 104 or the deposition tool 112. Therefore, the above description should not be interpreted as a limitation on the scope of the present disclosure but merely an illustration.

The deposition tools 104, 112 may include any deposition process tool known in the art. For example, the deposition tools 104, 112 may include, but are not limited to, a film deposition (e.g., chemical vapor deposition (CVD)) tool. In another embodiment, the deposition tools 104, 112 deposit a layer of material on the sample 106 based on an operating recipe. In another embodiment, the operating recipe and/or the deposition tools 104, 112 may be adjusted in a feed forward or a feedback loop based on one or more measurements obtained of already-deposited layers via the interferometer tool 110 and/or based on one or more estimated error prediction processes via a controller, as described in detail further herein.

It is noted herein the system 100 may include any fabrication process tool known in the art instead of the deposition tools 104, 112. For example, the system 100 may include, but is not limited to a lithography process tool, a chemical-mechanical polishing (CMP) process tool, an etching process tool, and/or an ion implantation process tool. Accordingly, the description of the deposition tools 104, 112 is not intended to limit the present disclosure in any way, and the above description should not be interpreted as a limitation on the scope of the present disclosure but merely an illustration.

The interferometer tool 110 may include any interferometer tool known in the art. For example, the interferometer tool 110 may be configured to measure any number of spatial characteristics of the sample 106 including, but not limited to, flatness, shape variation, thickness variation, and/or any other spatial parameter variations of the sample 106. It is noted herein the spatial characteristics of the sample 106 may be related to the wafer geometry of the sample 106, and may additionally be represented by out-of-plane distortions (OPD). A description of the use of wafer geometry metrics for overlay and semiconductor process control is described in U.S. Pat. No. 9,354,526, issued May 31, 2016, which is incorporated herein in the entirety. Additionally, a description of the use of wafer geometry metrics for overlay and semiconductor process control is described in U.S. Patent Publication No. 2016/0372353, published on Dec. 22, 2016, which is incorporated herein in its entirety.

By way of another example, the interferometer tool 110 may include, but is not limited to, a dual wavelength dual interferometer. For instance, the dual wavelength dual interferometer may include, but is not limited to, a dual wavelength dual Fizeau interferometer (DWDFI). By way of another example, the interferometer tool 110 may be adapted to perform patterned wafer geometry (PWG) measurements on the sample 106, whereby the dynamic range of the sample slope (e.g., wafer slope) measured by the interferometer tool 110 is extended by stitching measurement results of different regions of the sample 106 together.

A description of a dual wavelength dual interferometer is described in U.S. Pat. No. 6,847,458, issued on Jan. 25, 2005, which is incorporated herein by reference in the entirety. Additionally, a description of a dual wavelength dual interferometer is described in U.S. Pat. No. 8,068,234, issued on Nov. 29, 2011, which is incorporated herein by reference in the entirety. Further, a description of a dual wavelength dual interferometer is described in U.S. Patent Publication No. 2014/0293291, published on Oct. 2, 2014, which is incorporated herein by reference in the entirety. Further, a description of a dual wavelength dual interferometer used to measure shape and thickness of high slope samples is described in U.S. Pat. No. 7,847,954, issued on Dec. 7, 2010, which is incorporated herein by reference in the entirety.

It is noted herein the interferometer tool 110 may include, but is not limited to, a wafer dimensional geometry tool from the WaferSight metrology system line produced by KLA-Tencor, Milpitas, Calif. It is additionally noted herein that the present disclosure may be extended to any phase-shifting interferometry system configured to utilize a wavelength-tunable illumination source for phase shifting.

It is noted herein the system 100 may include any inspection tool or review tool known in the art instead of the interferometer tool 110. For example, the system 100 may include, but is not limited to, an electron beam inspection sub-system or review sub-system (e.g., a Scanning Electron Microscope (SEM) system). By way of another example, the system 100 may include, but is not limited to, an optical inspection sub-system. For instance, the optical inspection sub-system may include an optical inspection sub-system capable of generating one or more high-resolution images representing the electrical intent of the sample 106. Additionally, the optical inspection sub-system may include a broadband inspection sub-system including, but not limited to, a laser sustained plasma (LSP) based inspection sub-system. Further, the optical inspection sub-system may include a narrowband inspection sub-system, such as, but not limited to, a laser scanning inspection sub-system. Further, the optical inspection sub-system may include, but is not limited to, a brightfield imaging tool, or a darkfield imaging tool. It is noted herein that the system 100 may include any optical system configured to collect and analyze illumination reflected, scattered, diffracted, and/or radiated from a surface of the sample 106. In a general sense, although not shown here, the system 100 may include any inspection system suitable for inspecting one or more wafers, reticles, or photomasks. Accordingly, the following description of the interferometer tool 110 is not intended to limit the present disclosure in any way, and the above description should not be interpreted as a limitation on the scope of the present disclosure but merely an illustration.

The sample 106 may include any sample suitable for inspection and/or review. In one embodiment, the sample 106 includes a semiconductor wafer. As used through the present disclosure, the term "wafer" refers to a substrate formed of a semiconductor and/or a non-semiconductor material. For instance, in the case of a semiconductor material, the wafer may be formed from, but is not limited to, monocrystalline silicon, gallium arsenide, and/or indium phosphide. In another embodiment, the sample 106 includes a photomask/reticle. As such, the term wafer and the term sample may be used interchangeably in the present disclosure. Therefore, the above description should not be interpreted as a limitation on the scope of the present disclosure but merely an illustration.

While the fabrication, measurement, and error prediction techniques described herein refers mainly to samples 106 that are semiconductor wafers, it is to be understood that the techniques are also applicable to other types of thin polished plates as well. For example, the one or more thin polished plates may include, but are not limited to, one or more magnetic disc substrates, one or more gauge blocks, or the like. As such, the term wafer and the term thin polished plate may be used interchangeably in the present disclosure. Therefore, the above description should not be interpreted as a limitation on the scope of the present disclosure but merely an illustration.

In another embodiment, where the sample 106 is a wafer, the wafer 106 is manufactured using one or more sets of wafer design data. In another embodiment, the sets of wafer design data include one or more sets of layers. For example, such layers may include, but are not limited to, a resist, a dielectric material, a conductive material, and a semi-conductive material. Many different types of such layers are known in the art, and the term wafer as used herein is intended to encompass a wafer on which all types of such layers may be formed. By way of another example, the layers formed on the wafer may be repeated one or more times within the wafer. Formation and processing of such layers of material may ultimately result in completed devices. Many different types of devices may be formed on a wafer, and the term wafer as used herein is intended to encompass a wafer on which any type of device known in the art is being fabricated.

The sample stages 108, 114 may include any appropriate mechanical and/or robotic assembly known in the art of electron-beam microscopy. In one embodiment, the sample stages 108, 114 are actuatable stages. For example, the sample stages 108, 114 may include, but are not limited to, one or more translational stages suitable for selectably translating the sample 106 along one or more linear directions (e.g., x-direction, y-direction, and/or z-direction). By way of another example, the sample stages 108, 114 may include, but are not limited to, one or more rotational stages suitable for selectively rotating the sample 106 along a rotational direction. By way of another example, the sample stages 108, 114 may include, but are not limited to, a rotational stage and a translational stage suitable for selectably translating the semiconductor device along a linear direction and/or rotating the sample 106 along a rotational direction. By way of another example, the sample stages 108, 114 may be configured to translate or rotate the sample 106 for positioning, focusing, and/or scanning in accordance with a selected inspection or metrology algorithm, several of which are known to the art.

Figure 2A:
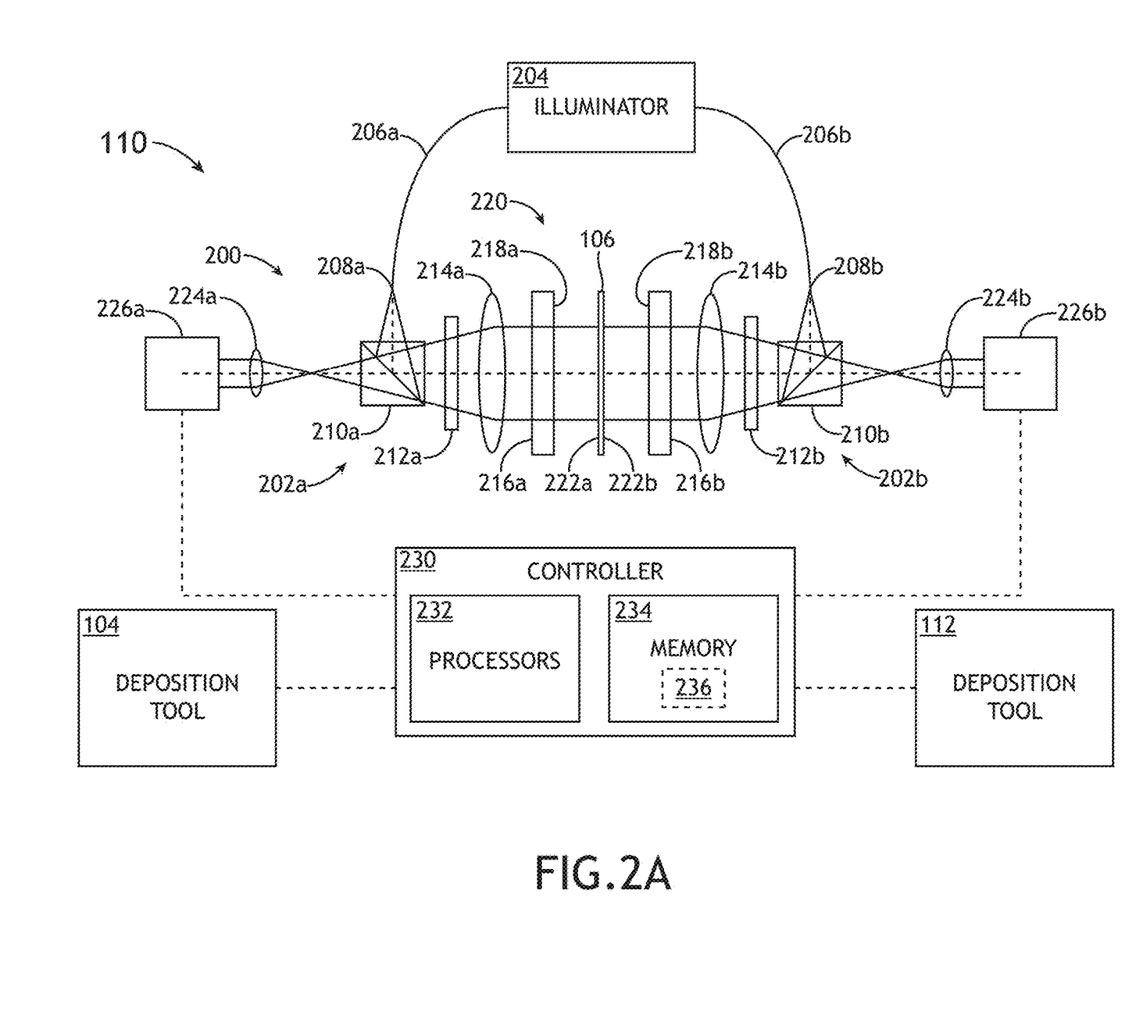
FIG. 2A illustrates a simplified schematic view of an interferometer tool of a system for process-induced distortion prediction during wafer deposition, in accordance with one or more embodiments of the present disclosure.
Figure 2B:
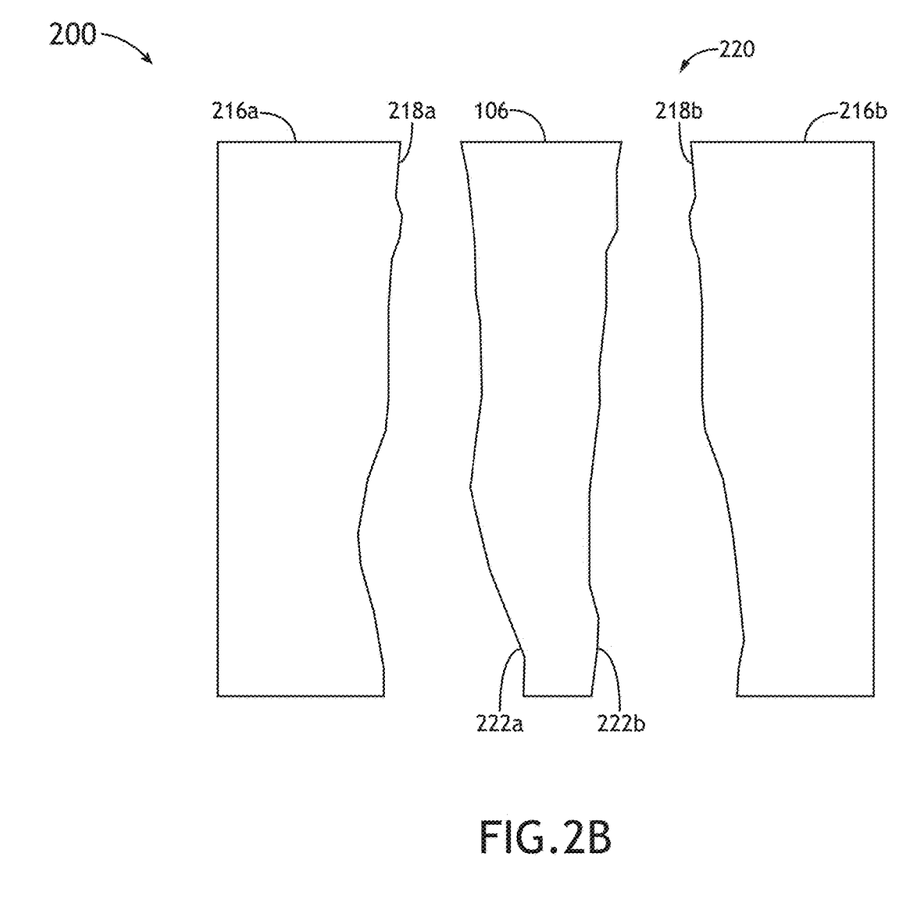
FIG. 2B illustrates a simplified schematic view of a cavity of an interferometer tool, in accordance with one or more embodiments of the present disclosure.
Figure 2C:
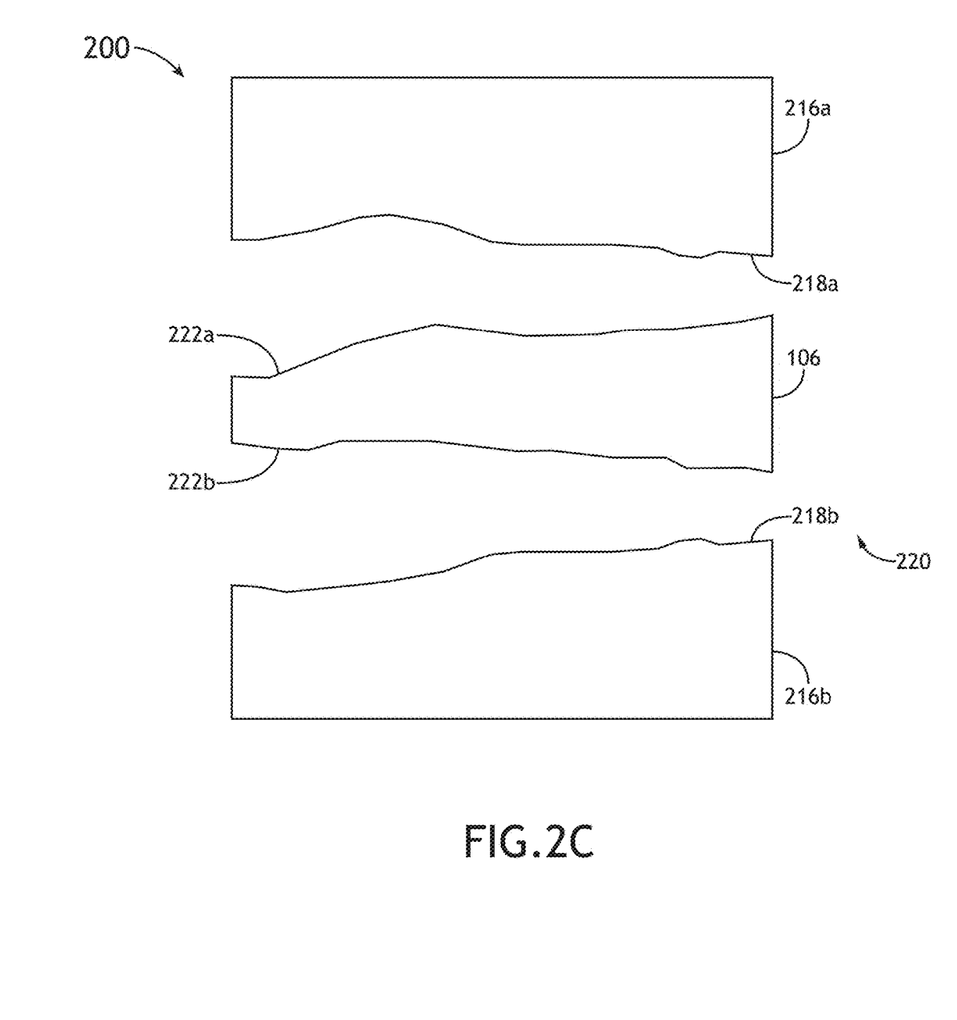
FIG. 2C illustrates a simplified schematic view of a cavity of an interferometer tool, in accordance with one or more embodiments of the present disclosure.

FIGS. 2A-2C generally illustrate the interferometer tool 110 of the system 100 for process-induced distortion prediction during wafer deposition, in accordance with one or more embodiments of the present disclosure.

In one embodiment, the interferometer tool 110 includes a dual wavelength dual interferometer 200. In another embodiment, the dual wavelength dual interferometer 200 includes an interferometer 202a and an interferometer 202b. In another embodiment, the dual wavelength dual interferometer 200 includes an illumination source, or illuminator, 204.

The illuminator 204 may include any illumination source known in the art. For example, the illuminator 204 may include, but is not limited to, a broadband light source (e.g., a Xenon lamp) or a narrowband light source (e.g., a laser). By way of another example, the illumination source may be configured to generate EUV light. For instance, the EUV light source may include a discharge produced plasma (DPP) light source or a laser produced plasma (LPP) light source configured to generate light in the EUV range.

In another embodiment, the illuminator 204 generates and directs light (e.g., a beam of illumination) via a first light channel or a second light channel to a polarizing beam splitter 210a or 210b of the interferometer 202a or 202b, where the first light channel or the second light channel includes an optical fiber 206a or 206b and an interferometer input 208a or 208b. In another embodiment, the polarizing beam splitters 210a, 210b direct a portion of received light to a quarter-wave plate 212a or 212b. For example, light passing through the polarizing beam splitters 210a, 210b and through the quarter-wave plates 212a, 212b may be circularly polarized. In another embodiment, the light is directed by the quarter-wave plates 212a, 212b through a lens 214a or 214b. For example, the lenses 214a, 214b may be configured to collimate the light into beams having a diameter greater than a diameter of the sample 106. In another embodiment, the light is directed by the lenses 214a, 214b through a reference flat 216a or 216b. For example, the reference flats 216a, 216b may be substantially parallel. In another embodiment, the reference flats 216a, 216b include a surface 218a or 218b.

It is noted herein the interferometers 202a, 202b may include one or more additional optical elements including any optical element known in the art suitable for focusing, suppressing, extracting, and/or directing the light generated by the illuminator 204 towards the sample 106.

In another embodiment, the sample 106 is positioned within a cavity 220 defined by the surfaces 218a, 218b. In another embodiment, a portion of the light is transmitted through the reference flats 216a, 216b and directed onto a surface 222a or 222b of the sample 106. In another embodiment, a portion of the light is transmitted through the reference flats 216a, 216b and directed onto the reference flat 216a, 216b located opposite of the transmitting reference flat 216a, 216b.

Referring now to FIGS. 2B and 2C, the cavity 220 of the interferometer tool 110 is illustrated, in accordance with one or more embodiments of the present disclosure.

In one embodiment, the cavity 220 includes one or more point contact devices to hold the sample 106 between the surfaces 218a, 218b of the reference flats 216a, 216b. In another embodiment, the interferometer tool 110 utilizes the reference flats 216a, 216b as the reference surfaces for the interferometers 202a, 202b to analyze one or more parameters associated with the sample 106 and its spatial relationship to the reference flats 216a, 216b. A description of the development and usage of systems and methods for measuring film thickness distribution of a wafer (e.g., by analyzing one or more parameters associated with the sample 106 and its spatial relationship to the reference flats 216a, 216b) is described in U.S. patent application Ser. No. 15/622,629, filed Jun. 14, 2017, which is incorporated herein in the entirety.

In another embodiment, as illustrated in FIG. 2B, the one or more point contact devices hold the sample 106 in a substantially vertical position within the cavity 220 between the surfaces 218a, 218b of the reference flats 216a, 216b. In this regard, plane warping of the sample 106 may be apparent while one or more measurements are obtained of the sample 106, as opposed to when the sample 106 is chucked in a substantially horizontal position (e.g., mounted on the sample stages 108, 114 of the deposition tools 104, 112), which may serve to reduce, remove, and/or negate the warp.

In another embodiment, as illustrated in FIG. 2C, the one or more point contact device hold the sample 106 in a substantially horizontal position within the cavity 220 between the surfaces 218a, 218b of the reference flats 216a, 216b. In another embodiment, the sample 106 experiences gravitational sag if held in a substantially horizontal position. For example, a bare sample 106 may experience gravitational sag that is measurable when held in a substantially horizontal position rather than a substantially vertical position. It is noted herein, however, that the contribution of the gravitational sag to the deposition and/or fabrication error may be much smaller than the contribution of the warping caused by the film stress of a deposited layer on the bare sample 106. In this regard, the errors measured on the sample 106 including one or more deposited layers may not be substantially affected by the orientation of the sample 106 within the cavity 220.

Although embodiments of FIG. 2A are directed to the vertical cavity 220 as illustrated in FIG. 2B, it is noted herein that the dual wavelength dual interferometer 200 may include one or more additional optics necessary to form the substantially horizontal cavity 220 in FIG. 2C. Therefore, the above description should not be interpreted as a limitation on the scope of the present disclosure but merely an illustration.

Referring again to FIG. 2A, in one embodiment, the dual wavelength dual interferometer 200 detects one or more defects on the surfaces 222a, 222b of the sample 106. For purposes of the present disclosure, a defect may be classified as a void, short, particle, residue, scum, overlay error, in-plane distortion, out-of-plane distortion, or any other defect known in the art.

In another embodiment, the dual wavelength dual interferometer 200 detects one or more defects on the sample 106 via a detector 226a or 226b. The detectors 226a, 226b may be any detector known in the art. For example, the one or more detectors may include, but is not limited to, one or more photo-multiplier tubes (PMTs), one or more charge coupled devices (CCDs), one or more time-delay integration (TDI) cameras, or the like.

In another embodiment, the sample 106 reflects, scatters, diffracts, and/or radiates light (e.g., a beam of illumination). In another embodiment, the detectors 226a, 226b detect portions of light reflected, scattered, diffracted, and/or radiated from corresponding surfaces 222a, 222b of the sample 106 in response to the light directed by the reference flats 216a, 216b. In another embodiment, the detectors 226a, 226b detect portions of light transmitted through corresponding surfaces 218a, 218b of reference flats 216a, 216b in response to the collimated beams directed from the reference flats 216a, 216b located opposite the transmitting reference flats 216a, 216b.

In another embodiment, the light reflected from the surfaces 222a, 222b of the sample 106 and/or the light transmitted through corresponding surfaces 218a, 218b of reference flats 216a, 216b is directed to the detectors 226a, 226b via a lens 224a or 224b. For example, the lenses 224a, 224b may be positioned between the lenses 214a, 214b and the detectors 226a, 226b at a distance from the lenses 214a, 214b either greater than, less than, or equal to the focal length of the lenses 214a, 214b.

It is noted herein the interferometers 202a, 202b may include one or more additional optical elements including any optical element known in the art suitable for focusing, suppressing, extracting, and/or directing the light generated by the illuminator 204 towards the detectors 226a, 226b.

In another embodiment, the interferometer tool 110 includes one or more controllers 230. In another embodiment, the controller 230 includes one or more processors 232 and memory 234. In another embodiment, the memory 234 stores one or more sets of program instructions 236. In another embodiment, the one or more sets of program instructions 236 are configured to cause the one or more processors 232 to carry out any of the one or more process steps described throughout the present disclosure.

In another embodiment, the one or more controllers 230 executes one or more measurement algorithms and/or modelling processes from program instructions 236 stored on memory 234 via the one or more processors 232. In another embodiment, the measurement algorithms and/or modelling processes determine one or more spatial characteristics of the sample 106 based on the one or more obtained measurements of the sample 106. It is noted herein that any measurement algorithms and/or modelling processes for determining spatial characteristics of samples with phase-shifting interferometry systems known in the art may be implemented with the one or more controllers 230 of the interferometer tool 110. For example, the measurements algorithms may estimate in-plane distortions (IPD) of the sample 106 chucked up in the deposition tools 104, 112 based on one or more out-of-plane distortions (OPD) of the sample 106 measured by the interferometer tool 110.

A description of methods for obtaining film stress and substrate curvature measurements is described in Freund, L. B., and S. Suresh, *Thin Film Materials: Stress, Defect Formation and Surface Evolution*, Cambridge, Cambridge University Press, 2004. Additionally, a description of the development and usage of a finite element (FE) model-based distortion prediction to determine relationships between changes in wafer geometry and overlay errors in semiconductor devices is described in Turner et al., *Monitoring Process-Induced Overlay Errors through High-Resolution Wafer Geometry Measurements*, Proc. SPIE 9050, Metrology, Inspection, and Process Control for Microlithography) (XVIII, 905013 (2 Apr. 2014), which is incorporated herein in the entirety. Additionally, a description of the use of predictive modeling for IPD is described in U.S. Pat. No. 9,087,176, issued Jul. 21, 2015, which is incorporated herein in the entirety. Further, a description of the use of FE model-based prediction to emulate IPD is described in U.S. Pat. No. 9,430,593, issued Aug. 30, 2016, which is incorporated herein in the entirety. Further, a description of the use of FE model-based prediction to emulate IPD is described in U.S. Patent Publication No. 2016/0283625, issued Sep. 29, 2016, which is incorporated herein in the entirety. Further, a description of the use of an FE model to determine in-plane distortion (IPD) from out-of-plane distortions (OPD) is described in U.S. Patent Publication No. 2015/0120216, published Apr. 30, 2015, which is incorporated herein in the entirety.

In another embodiment, the controller 230 is operably coupled to one or more components of the system 100. For example, the controller 230 may be operably coupled to the detectors 226a, 226b of the interferometers 202a, 202b; the deposition tool 104; the deposition tool 112; and/or a user interface. In this regard, the controller 230 may direct any of the components of the system 100 and/or any components of the tools 104, 110, 112 of the tool cluster 102 of the system 100 to carry out any one or more of the various functions described throughout the present disclosure.

The controller 230 may be configured to receive and/or acquire data or information from other systems or sub-systems (e.g., one or more sets of information from the detectors 226a, 226b of the interferometers 202a, 202b; the deposition tool 104; the deposition tool 112; and/or the user interface) of the system 100 via a transmission medium that may include wireline and/or wireless portions. The controller 230 may additionally be configured to transmit data or information (e.g., the output of one or more procedures of the inventive concepts disclosed herein) to one or more systems or sub-systems (e.g., one or more sets of information from the detectors 226a, 226b of the interferometers 202a, 202b; the deposition tool 104; the deposition tool 112; and/or the user interface) of the system 100 by a transmission medium that may include wireline and/or wireless portions. In this regard, the transmission medium may serve as a data link between the controller and the other subsystems of the system 100. Additionally, the controller 230 may be configured to send data to external systems via a transmission medium (e.g., network connection).

The one or more processors 232 may include any one or more processing elements known in the art. In this sense, the one or more processors 232 may include any microprocessor device configured to execute algorithms and/or program instructions. For example, the one or more processors 232 may consist of a desktop computer, mainframe computer system, workstation, image computer, parallel processor, handheld computer (e.g., tablet, smartphone, or phablet), or other computer system (e.g., networked computer). In general, the term "processor" may be broadly defined to encompass any device having one or more processing elements, which execute the one or sets of program instructions 236 from a non-transitory memory medium (e.g., the memory 234). Moreover, different subsystems of the system 100 (e.g., one or more sets of information from the detectors 226a, 226b of the interferometers 202a, 202b; the deposition tool 104; the deposition tool 112; and/or the user interface) may include processor or logic elements suitable for carrying out at least a portion of the steps described throughout the present disclosure. Therefore, the above description should not be interpreted as a limitation on the present disclosure but merely an illustration.

The memory 234 may include any storage medium known in the art suitable for storing the one or more sets of program instructions 236 executable by the associated one or more processors 232. For example, the memory 234 may include a non-transitory memory medium. For instance, the memory 234 may include, but is not limited to, a read-only memory, a random access memory, a magnetic or optical memory device (e.g., disk), a magnetic tape, a solid state drive, and the like. The memory 234 may be configured to provide display information to a display device of the user interface. The memory 234 may additionally be configured to store user input information from a user input device of the user interface. The memory 234 may be housed in a common controller 230 housing with the one or more processors 232. The memory 234 may, alternatively or in addition, be located remotely with respect to the spatial location of the processors 232 and/or the controller 230. For instance, the one or more processors 232 and/or the controller 230 may access a remote memory 234 (e.g., server), accessible through a network (e.g., internet, intranet, and the like).

In one embodiment, the interferometer tool 110 includes the user interface. In another embodiment, the user interface includes the display. In another embodiment, the user interface includes the user input device. In another embodiment, the display device is coupled to the user input device. For example, the display device may be coupled to the user input device by a transmission medium that may include wireline and/or wireless portions.

The display device may include any display device known in the art. For example, the display device may include, but is not limited to, a liquid crystal display (LCD). By way of another example, the display device may include, but is not limited to, an organic light-emitting diode (OLED) based display. By way of another example, the display device may include, but is not limited to a CRT display. Those skilled in the art should recognize that a variety of display devices may be suitable for implementation in the present invention and the particular choice of display device may depend on a variety of factors, including, but not limited to, form factor, cost, and the like. In a general sense, any display device capable of integration with a user input device (e.g., touchscreen, bezel mounted interface, keyboard, mouse, trackpad, and the like) is suitable for implementation in the present invention.

The user input device may include any user input device known in the art. For example, the user input device may include, but is not limited to, a keyboard, a keypad, a touchscreen, a lever, a knob, a scroll wheel, a track ball, a switch, a dial, a sliding bar, a scroll bar, a slide, a handle, a touch pad, a paddle, a steering wheel, a joystick, a bezel input device, or the like. In the case of a touchscreen interface, those skilled in the art should recognize that a large number of touchscreen interfaces may be suitable for implementation in the present invention. For instance, the display device may be integrated with a touchscreen interface, such as, but not limited to, a capacitive touchscreen, a resistive touchscreen, a surface acoustic based touchscreen, an infrared based touchscreen, or the like. In a general sense, any touchscreen interface capable of integration with the display portion of a display device is suitable for implementation in the present invention. In another embodiment, the user input device may include, but is not limited to, a bezel mounted interface.

Figure 3:
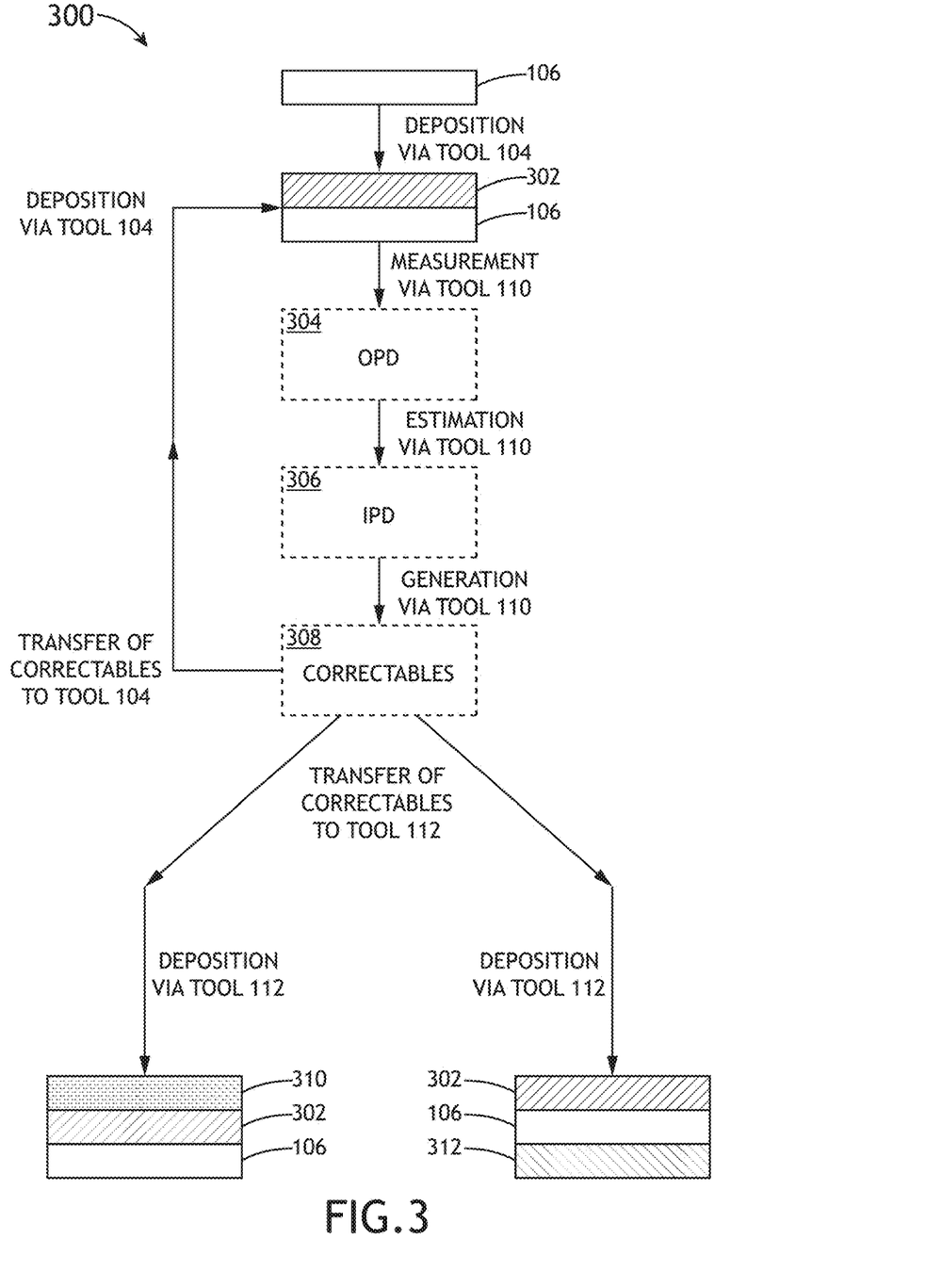
FIG. 3 illustrates a conceptual view of a film/coating deposition process on a sample, in accordance with one or more embodiments of the present disclosure.

FIG. 3 illustrates a conceptual view of a film/coating deposition process 300, in accordance with one or more embodiments of the present disclosure.

In one embodiment, a layer 302 is deposited on a surface (e.g., side) of the sample 106 via the deposition tool 104. For example, the layer 302 may be deposited on the front side or the back side of the sample 106. In another embodiment, the sample 106 is transferred to the interferometer tool 110. For example, the sample 106 may be transferred to and/or from the interferometer tool 110 without breaking the vacuum generated by the vacuum assembly 116 of the tool cluster 102 between deposition steps as performed by the deposition tools 104, 112.

In another embodiment, the interferometer tool 110 obtains one or more measurements 304 of the sample 106. For example, the one or more measurements 304 of the sample 106 may include one or more OPD (e.g., wafer geometry variations) including, but not limited to, one or more shape variations, one or more thickness variations, one or more flatness variations, one or more warping errors, one or more bowing errors, or the like. Descriptions of wafer geometry variations are described in U.S. Pat. No. 9,354,526 and U.S. Patent Publication No. 2016/0372353, each previously incorporated herein in the entirety.

In another embodiment, the controller 230 of the interferometer tool 110 estimates one or more IPD 306 based on the one or more measurements 304. For example, the one or more IPD 306 may be estimated from the one or more OPD via one or more mathematical algorithms and/or one or more modelling processes (e.g., finite element modelling). A description of obtaining film stress and substrate curvature measurements is described in *Thin Film Materials: Stress, Defect Formation and Surface Evolution* by Freund et al., previously incorporated herein by reference in the entirety. Descriptions of wafer IPD and OPD, and the processes of estimating wafer IPD based on measured wafer OPD, are described in *Monitoring Process-Induced Overlay Errors through High-Resolution Wafer Geometry Measurements* by Turner et al.; U.S. Pat. Nos. 9,807,176; 9,430,593; U.S. Patent Publication No. 2016/0283625; and U.S. Patent Publication No. 2015/0120216, each previously incorporated herein by reference in the entirety.

In another embodiment, one or more correctables 308 are determined from the one or more estimated IPD 306. For example, the one or more correctables 308 may be determined by the controller 230. By way of another example, the one or more correctables 308 may include one or more adjustments and/or compensations in response to the estimated one or more IPD 306 within the sample 106.

In another embodiment, the one or more correctables 308 are transferred to a deposition tool, where the layer-depositing process of the deposition tool is adjustable based on the one or more correctables 308. For example, the one or more correctables 308 may be transferred to the deposition tool 104 via a feed forward loop, where the deposition tool 104 adjusts the depositing of the layer 302 on subsequent samples 106. By way of another example, the one or more correctables 308 may be transferred to the deposition tool 112 via a feedback loop, where the deposition tool 112 adjusts the depositing of a subsequent layer on the measured sample 106. For instance, the deposition tool 112 may adjust the depositing of a layer 310 on the layer 302 or a layer 312 on a surface of the sample 106 opposite the surface of the sample 106 including the layer 302. In this regard, errors in the layer 302 may be adjusted for and reduced on subsequent samples and/or compensated for in subsequent layers.

In another embodiment, where the sample 106 includes a front side layer 302 and a back side layer 312, integrating the interferometer tool 110 into the tool cluster 102 with the deposition tools 104, 112 allows for measurements to be obtained of the layer 302 and/or the layer 312 separately. It is noted herein that measuring the front side layer 302 and the back side layer 312 together may result in measurements where stress in the front side layer 302 and the back side layer 312 substantially cancel, leading to no (or negligible) observed OPD. In contrast, measuring the front side layer 302 and/or the back side layer 312 separately may result in distinct characterizations of the film stress caused by each respective layer 302, 312.

Figure 4:
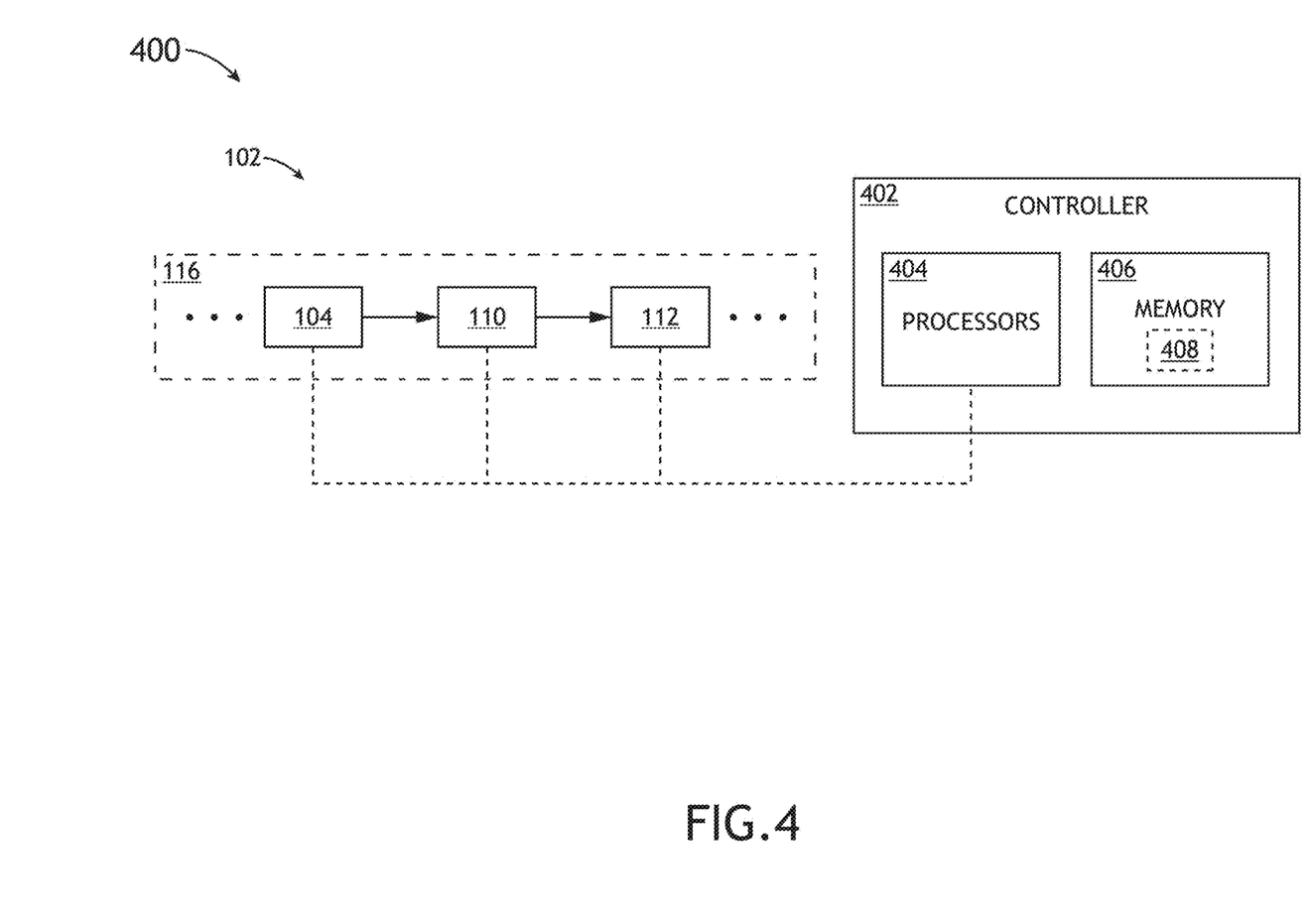
FIG. 4 illustrates a block diagram view of a system for process-induced distortion prediction during wafer deposition, in accordance with one or more embodiments of the present disclosure.

FIG. 4 illustrates a block diagram view of a system 400 for process-induced distortion prediction during wafer deposition, in accordance with one or more embodiments of the present disclosure. It is noted herein that the embodiments directed to the system 100 may additionally be directed to the system 400. Therefore, the above description should not be interpreted as a limitation on the present disclosure but merely an illustration.

In one embodiment, the system 400 includes the tool cluster 102. In another embodiment, the tool cluster 102 includes one or more of the deposition tool 104, the interferometer tool 110, the deposition tool 112, and/or the vacuum assembly 116. In another embodiment, the system 400 includes a controller 402 communicatively coupled to one or more of the deposition tool 104, the interferometer tool 110, and/or the deposition tool 112. In another embodiment, the controller 402 includes one or more processors 404 and memory 406. In another embodiment, the memory 406 stores one or more sets of program instructions 408. In another embodiment, the one or more sets of program instructions 408 are configured to cause the one or more processors 404 to carry out any of the one or more process steps described throughout the present disclosure.

In another embodiment, a user interface is communicatively coupled to the controller 402. In another embodiment, the user interface includes a display. In another embodiment, the user interface includes a user input device.

It is noted herein that the embodiments directed to the controller 230, the one or more processors 232, the memory 234, the program instructions 236, and/or the user interface communicatively coupled to the controller 230 may additionally be directed to the controller 402, the one or more processors 404, the memory 406, the program instructions 408, and/or the user interface communicatively coupled to the controller 402. Therefore, the above description should not be interpreted as a limitation on the present disclosure but merely an illustration.

It is noted herein that the controller 230 and the controller 402 may be separate components or a single component of the system 400. Therefore, the above description should not be interpreted as a limitation on the present disclosure but merely an illustration.

Figure 5:
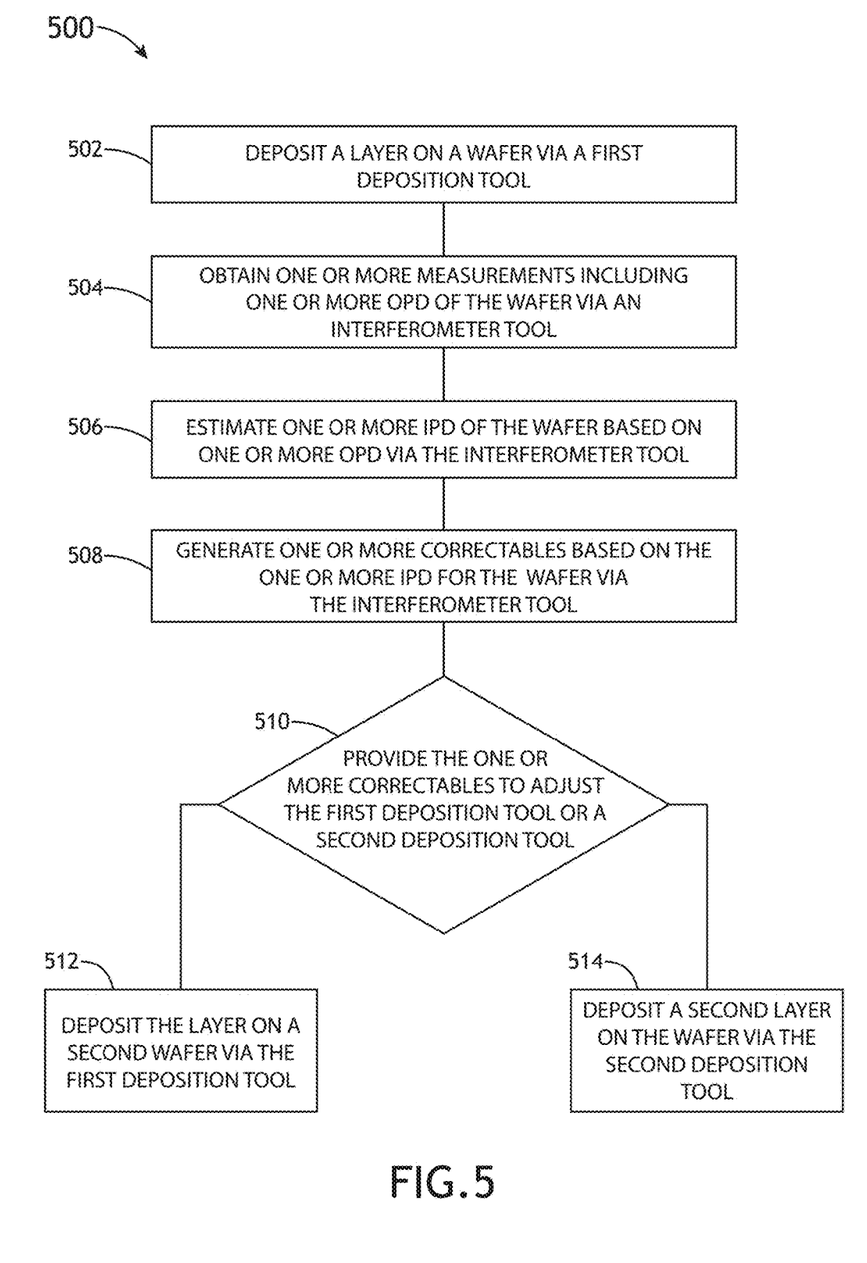
FIG. 5 illustrates a process flow diagram depicting a method for process-induced distortion prediction during wafer deposition, in accordance with one or more embodiments of the present disclosure.

FIG. 5 illustrates a process flow diagram depicting a method 500 for process-induced distortion prediction during wafer deposition, in accordance with one or more embodiments of the present disclosure. It is noted herein that the steps of method 500 may be implemented all or in part by the systems 100, 400. It is recognized, however, that the method 500 is not limited to the systems 100, 400 in that additional or alternative system-level embodiments may carry out all or part of the steps of method 500.

In step 502, a layer is deposited on a wafer via a first deposition tool. In one embodiment, the deposition tool 104 deposits the layer 302 on the wafer 106. For example, the layer 302 may be deposited on either the front side or the back side of the wafer 106.

In step 504, one or more measurements including one or more OPD of the wafer are obtained via an interferometer tool. In another embodiment, the wafer 106 with layer 302 is transferred from the deposition tool 104 to the interferometer tool 110. For example, the wafer 106 may be transferred without breaking the vacuum generated by the vacuum assembly 116 of the tool cluster 102. In another embodiment, the interferometer tool 110 obtains one or more measurements of the wafer 106. For example, the one or more measurements may include one or more OPD (e.g., wafer geometry variations) of the layer 302 on the wafer 106 including, but not limited to, one or more shape variations, one or more thickness variations, one or more flatness variations, or the like. Descriptions of wafer geometry variations are described in U.S. Pat. No. 9,354,526 and U.S. Patent Publication No. 2016/0372353, each previously incorporated herein in the entirety.

In step 506, one or more IPD of the wafer are estimated based on the one or more OPD via the interferometer tool. In one embodiment, the controller 230 of the interferometer tool 110 estimates one or more IPD of the layer 302 on the wafer 106. For example, the one or more IPD are estimated based on the one or more OPD of the layer 302 deposited on the wafer 106 via one or more mathematical algorithms and/or one or more modelling processes (e.g., finite element modelling). A description of obtaining film stress and substrate curvature measurements is described in *Thin Film Materials: Stress, Defect Formation and Surface Evolution* by Freund et al., previously incorporated herein by reference in the entirety. Descriptions of wafer IPD and OPD, and the processes of estimating wafer IPD based on measured wafer OPD, are described in *Monitoring Process-Induced Overlay Errors through High-Resolution Wafer Geometry Measurements* by Turner et al.; U.S. Pat. Nos. 9,807,176; 9,430,593; U.S. Patent Publication No. 2016/0283625; U.S. Patent Publication No. 2015/0120216, each previously incorporated herein by reference in the entirety.

In step 508, one or more correctables are determined for the wafer via the interferometer tool. In one embodiment, the controller 230 of the interferometer tool 110 determines the one or more correctables based on the estimated one or more IPD of the layer 302 on the wafer 106.

In step 510, the one or more correctables are provided to adjust the first deposition tool or a second deposition tool. In one embodiment, the one or more correctables are provided to the deposition tool 104 via a feed forward loop. In another embodiment the one or more correctables are provided to the deposition tool 112 via a feedback loop.

In step 512, the layer is deposited on a second wafer via the first deposition tool. In one embodiment, the deposition tool 104 is adjusted to reduce the errors in the layer 302 generated during deposition based on the one or more correctables provided by the controller 230 of the interferometer tool 110. For example, the deposition tool 104 may be adjusted to reduce one or more predicted IPD errors in the layer 302, per the estimation based on the one or more OPD measured in the sample 106 via the interferometer tool 110.

In step 514, a second layer is deposited on the wafer via the second deposition tool. In one embodiment, the deposition tool 112 is adjusted to compensate for the errors in the layer 302 during deposition of the layer 310 or the layer 312 based on the one or more correctables provided by the controller 230 of the interferometer tool 110. For example, the deposition tool 112 may be adjusted to compensate for the one or more predicted IPD errors in the layer 302, per the estimation based on the one or more OPD measured in the sample 106 via the interferometer tool 110.

Advantages of the present disclosure include a semiconductor fabrication system including one or more deposition tools and one or more interferometer tools. Advantages of the present disclosure also include measuring a layer deposited on a semiconductor wafer between deposition steps without breaking vacuum of the semiconductor fabrication system. Advantages of the present disclosure also include estimating process-induced distortion (e.g., predicting IPD) of the semiconductor wafer based on errors (e.g., OPD) in a measured layer of the semiconductor wafer. Additional advantages of the present disclosure include determining one or more correctables based on the estimated process-induced distortion. Advantages of the present disclosure also include providing the one or more correctables to adjust a fabrication recipe of the deposition tool via a feed forward loop and/or a feedback loop.

One skilled in the art will recognize that the herein described components (e.g., operations), devices, objects, and the discussion accompanying them are used as examples for the sake of conceptual clarity and that various configuration modifications are contemplated. Consequently, as used herein, the specific exemplars set forth and the accompanying discussion are intended to be representative of their more general classes. In general, use of any specific exemplar is intended to be representative of its class, and the non-inclusion of specific components (e.g., operations), devices, and objects should not be taken limiting.

With respect to the use of substantially any plural and/or singular terms herein, those having skill in the art can translate from the plural to the singular and/or from the singular to the plural as is appropriate to the context and/or application. The various singular/plural permutations are not expressly set forth herein for sake of clarity.

The herein described subject matter sometimes illustrates different components contained within, or connected with, different other components. It is to be understood that such depicted architectures are merely exemplary, and that in fact many other architectures may be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality, and any two components capable of being so associated can also be viewed as being "operably couplable," to each other to achieve the desired functionality. Specific examples of operably couplable include but are not limited to physically mateable and/or physically interacting components, and/or wirelessly interactable, and/or wirelessly interacting components, and/or logically interacting, and/or logically interactable components.

In some instances, one or more components may be referred to herein as "configured to," "configurable to," "operable/operative to," "adapted/adaptable," "able to," "conformable/conformed to," etc. Those skilled in the art will recognize that such terms (e.g., "configured to") can generally encompass active-state components and/or inactive-state components and/or standby-state components, unless context requires otherwise.

While particular aspects of the present subject matter described herein have been shown and described, it will be apparent to those skilled in the art that, based upon the teachings herein, changes and modifications may be made without departing from the subject matter described herein and its broader aspects and, therefore, the appended claims are to encompass within their scope all such changes and modifications as are within the true spirit and scope of the subject matter described herein. It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to claims containing only one such recitation, even when the same claim includes the introductory phrases "one or more" or "at least one" and indefinite articles such as "a" or "an" (e.g., "a" and/or "an" should typically be interpreted to mean "at least one" or "one or more"); the same holds true for the use of definite articles used to introduce claim recitations. In addition, even if a specific number of an introduced claim recitation is explicitly recited, those skilled in the art will recognize that such recitation should typically be interpreted to mean at least the recited number (e.g., the bare recitation of "two recitations," without other modifiers, typically means at least two recitations, or two or more recitations). Furthermore, in those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). In those instances where a convention analogous to "at least one of A, B, or C, etc." is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, etc.). It will be further understood by those within the art that typically a disjunctive word and/or phrase presenting two or more alternative terms, whether in the description, claims, or drawings, should be understood to contemplate the possibilities of including one of the terms, either of the terms, or both terms unless context dictates otherwise. For example, the phrase "A or B" will be typically understood to include the possibilities of "A" or "B" or "A and B."

With respect to the appended claims, those skilled in the art will appreciate that recited operations therein may generally be performed in any order. Also, although various operational flows are presented in a sequence(s), it should be understood that the various operations may be performed in other orders than those which are illustrated, or may be performed concurrently. Examples of such alternate orderings may include overlapping, interleaved, interrupted, reordered, incremental, preparatory, supplemental, simultaneous, reverse, or other variant orderings, unless context dictates otherwise. Furthermore, terms like "responsive to," "related to," or other past-tense adjectives are generally not intended to exclude such variants, unless context dictates otherwise.

Although particular embodiments of this invention have been illustrated, it is apparent that various modifications and embodiments of the invention may be made by those skilled in the art without departing from the scope and spirit of the foregoing disclosure. It is believed that the present disclosure and many of its attendant advantages will be understood by the foregoing description, and it will be apparent that various changes may be made in the form, construction and arrangement of the components without departing from the disclosed subject matter or without sacrificing all of its material advantages. The form described is merely explanatory, and it is the intention of the following claims to encompass and include such changes. Accordingly, the scope of the invention should be limited only by the claims appended hereto.

What is claimed:

1. A system, comprising:
    a tool cluster; the tool cluster comprising:
        a first deposition tool configured to deposit a first layer on a wafer;
        an interferometer tool configured to obtain one or more measurements of the wafer, wherein the one or more measurements include one or more out-of-plane distortion (OPD) measurements of the wafer;
        a second deposition tool configured to deposit a second layer on the wafer; and
        a vacuum assembly,
    wherein one or more correctables configured to adjust at least one of the first deposition tool or the second deposition tool are determined based on the one or more measurements,
    wherein the one or more measurements are obtained between the deposition of the first layer and the deposition of the second layer without breaking the vacuum generated by the vacuum assembly.

2. The system in claim 1, wherein the interferometer tool comprises a dual wavelength dual interferometer.

3. The system in claim 2, wherein the dual wavelength dual interferometer obtains the one or more measurements by illuminating one or more surfaces of the wafer.

4. The system in claim 3, wherein the dual wavelength dual interferometer holds the wafer within a cavity between a set of substantially parallel reference plates.

5. The system in claim 4, wherein the dual wavelength dual interferometer holds the wafer within a cavity between a set of substantially parallel reference plates in a substantially vertical orientation.

6. The system in claim 4, wherein the dual wavelength dual interferometer holds the wafer within a cavity between a set of substantially parallel reference plates in a substantially horizontal orientation.

7. The system in claim 2, wherein the dual wavelength dual interferometer includes a controller, wherein the controller includes one or more processors, wherein the controller includes memory configured to store one or more sets of program instructions, wherein the one or more processors are configured to execute the one or more sets of program instructions.

8. The system in claim 7, wherein the controller estimates one or more in-plane distortions (IPD) of the wafer based on the one or more OPD of the wafer.

9. The system in claim 8, wherein the controller determines the one or more correctables configured to adjust at least one of the first deposition tool or the second deposition tool based on the estimated one or more IPD of the wafer.

10. The system in claim 9, wherein the controller provides the one or more correctables to adjust the first deposition tool via a feed forward loop.

11. The system in claim 10, wherein a deposition recipe of the first deposition tool corresponding to the first layer is adjustable based on the provided one or more correctables prior to depositing the first layer on a second wafer.

12. The system in claim 11, wherein the adjusting the deposition recipe corresponding to the first layer reduces one or more errors in the first layer deposited by the first deposition tool during deposition of the first layer on the second wafer.

13. The system in claim 9, wherein the controller provides the one or more correctables to adjust the second deposition tool via a feedback loop.

14. The system in claim 13, wherein a deposition recipe of the second deposition tool corresponding to the second layer is adjustable based on the provided one or more correctables prior to depositing the second layer on the wafer.

15. The system in claim 14, wherein the adjusting the deposition recipe corresponding to the second layer compensates for one or more errors in the first layer deposited by the first deposition tool during deposition of the second layer on the wafer.

16. The system in claim 1, further comprising:
    a controller, wherein the controller includes one or more processors, wherein the controller includes memory configured to store one or more sets of program instructions, wherein the one or more processors are configured to execute the one or more sets of program instructions,
    wherein the controller is communicatively coupled to at least one of the first deposition tool, the interferometer tool, or the second deposition tool.

17. A method, comprising:
    depositing a first layer on a wafer via a first deposition tool of a tool cluster;
    obtaining one or more measurements of the first layer on the wafer via an interferometer tool of the tool cluster, wherein the one or more measurements include one or more out-of-plane distortions;
    estimating one or more in-plane distortions for the first layer on the wafer via a controller of the interferometer tool of the tool cluster, wherein the one or more in-plane distortions are estimated based on the one or more out-of-plane distortions;
    determining one or more correctables for the wafer via the controller of the interferometer tool of the tool cluster, wherein the one or more correctables are determined based on the one or more in-plane distortions; and providing the one or more correctables to adjust at least one of the first deposition tool or a second deposition tool of the tool cluster, wherein the tool cluster includes a vacuum assembly, wherein the one or more measurements are obtained between the deposition of the first layer and the deposition of a second layer without breaking the vacuum of the vacuum assembly.

18. The method in claim 17, further comprising:
providing the one or more correctables to adjust the first deposition tool via a feed forward loop.

19. The method in claim 18, further comprising:
depositing the first layer on a second wafer via the first deposition tool,
wherein a deposition recipe of the first deposition tool corresponding to the first layer is adjustable based on the provided one or more correctables prior to depositing the first layer on the second wafer.

20. The method in claim 19, wherein the adjusting the deposition recipe corresponding to the first layer reduces one or more errors in the first layer deposited by the first deposition tool during deposition of the first layer on the second wafer.

21. The method in claim 17, further comprising:
providing the one or more correctables to adjust the second deposition tool via a feedback loop.

22. The method in claim 21, further comprising:
depositing the second layer on the wafer via the second deposition tool,
wherein a deposition recipe of the second deposition tool corresponding to the second layer is adjustable based on the provided one or more correctables prior to depositing the second layer on the wafer.

23. The method in claim 22, wherein the adjusting the deposition recipe corresponding to the second layer compensates for one or more errors in the first layer deposited by the first deposition tool during deposition of the second layer on the wafer.

* * * * *